United States Patent
Chen

(10) Patent No.: US 12,150,272 B2
(45) Date of Patent: Nov. 19, 2024

(54) HEAT DISSIPATING DEVICES

(71) Applicant: Kuan Hung Chen, New Taipei (TW)

(72) Inventor: Kuan Hung Chen, New Taipei (TW)

( * ) Notice: Subject to any disclaimer, the term of this patent is extended or adjusted under 35 U.S.C. 154(b) by 279 days.

(21) Appl. No.: 17/842,341

(22) Filed: Jun. 16, 2022

(65) Prior Publication Data

US 2023/0262927 A1    Aug. 17, 2023

(30) Foreign Application Priority Data

Feb. 11, 2022   (TW) .................................. 111105108

(51) Int. Cl.
*H05K 7/20*   (2006.01)

(52) U.S. Cl.
CPC ..... *H05K 7/20263* (2013.01); *H05K 7/20145* (2013.01); *H05K 7/20272* (2013.01)

(58) Field of Classification Search
CPC ...... F28D 3/04; F28D 3/02; F28D 3/00; F28F 13/003; F28F 25/04; F28F 25/02; F28F 2025/005; F28F 25/00; H05K 7/20272; H05K 7/20145; H05K 7/20263
See application file for complete search history.

(56) References Cited

U.S. PATENT DOCUMENTS

| | | | | |
|---|---|---|---|---|
| 2005/0019169 | A1* | 1/2005 | Kriehn | F04C 18/16 417/313 |
| 2016/0270254 | A1* | 9/2016 | Brianese | H05K 7/20154 |
| 2017/0135249 | A1* | 5/2017 | Jensen | H05K 7/20736 |
| 2021/0313247 | A1* | 10/2021 | Agonafer | H01L 23/427 |
| 2022/0142001 | A1* | 5/2022 | Pokharna | F28D 15/0266 361/700 |
| 2022/0159872 | A1* | 5/2022 | Tung | H05K 7/20327 |

FOREIGN PATENT DOCUMENTS

WO   WO-2021000510 A1 *  1/2021   ......... H05K 7/20745

OTHER PUBLICATIONS

Pdf is translation of foreign reference WO-2021000510 A1 (Year: 2021).*

* cited by examiner

*Primary Examiner* — Henry T Crenshaw
*Assistant Examiner* — Kamran Tavakoldavani
(74) *Attorney, Agent, or Firm* — Wang Law Firm, Inc.

(57) ABSTRACT

A heat dissipating device includes a box, a flow dispersion layer, a heat exchange layer, a fan and a pump, wherein the box includes a liquid storage part, a liquid-air mixing part, a liquid inlet, a liquid outlet, an air inlet and an air outlet, the flow dispersion layer is disposed in liquid-air mixing part and has a plurality of through holes, the heat exchange layer is disposed in liquid-air mixing part and has a continuous phase framework and pores, the fan is connected to the air inlet, and the pump is connected to the liquid outlet. The heat dissipating device forcibly disperses high temperature liquid, and prolongs falling time of the high temperature liquid, to allow low temperature air directly exchange heat with the high temperature liquid, so that the heat dissipation efficiency thereof is greatly enhanced to meet the demands of electronics, air conditioning and other industries.

9 Claims, 5 Drawing Sheets

HEAT DISSIPATING DEVICES

CROSS-REFERENCE TO RELATED APPLICATION

This application claims the priority of Taiwanese patent application No. 111105108, filed on Feb. 11, 2022, which is incorporated herewith by reference.

BACKGROUND OF THE INVENTION

1. Field of the Invention

The present application relates generally to a heat dissipating device, and more particularly, to a heat dissipating device including a liquid and air heat exchange structure.

2. The Prior Arts

With improvement of performance of various chips such as logic chips, graphic chips, memory chips, thermoelectric cooling chips, heat generated by operation of the chips greatly increases, if the heat generated by the chips cannot be removed, excessive temperature will affect the performance and life of the chips. Air-cooling methods using heat sink fins and fans cannot meet heat dissipating requirements of the high performance chips, there are heat dissipating devices of water-cooling type at present time, FIG. 1 schematically illustrates a conventional water-cooling type heat dissipating device. As shown in FIG. 1, a conventional water-cooling type heat dissipating device 1 includes a heat absorption plate 11, a heat exchange box 12, a pipeline 13, a fan 14 and a pump 15, wherein the heat absorption plate 11 is arranged on a heat generating surface of a chip 10, the pipeline 13 communicates with the heat absorption plate 11, the heat exchange box 12 and the pump 15, the fan 14 is arranged on the heat exchange box 12, the heat exchange box 12 includes a water storage chamber 121, a water drain chamber 122, a closed flow channel 123 and heat conducting sheets 124 connected to the closed flow channel 123.

When the conventional water-cooling type heat dissipating device 1 dissipates heat, the pump 15 transfers lower temperature water in the water drain chamber 122 to the heat absorption plate 11 to absorb the heat generated by the chip 10 through the pipeline 13, the water that absorbed heat flows out of the heat absorption plate 11 and flows into the water storage chamber 121 through the pipeline 13, the water at high temperature in the water storage chamber 121 flows into the closed flow channel 123 to conduct the heat to walls of the closed flow channel 123 and the heat conducting sheets 124, the fan 14 introduces outside air at lower temperature into the heat exchange box 12 to remove the heat of the closed flow channel 123 and the heat conducting sheets 124, the water at a reduced temperature flows into the water drain chamber 122, and the pump 15 transfers the water at reduced temperature again to the heat absorption plate 11 to absorb the heat generated by the chip 10.

During the aforesaid heat absorbing and dissipating process in unit time of the conventional water cooling type heat dissipating device, if the heat absorbed by the heat absorption plate and the water is less than the heat dissipated by the chip, or the heat absorbed by the closed flow channel and the heat conducting sheets is less than the heat dissipated by the water, then the temperature of the chip will gradually increase, and the performance thereof will be thus affected. In order to ensure the heat dissipation effect, the conventional water-cooling type heat dissipating device must use water of a large amount, the heat exchange box of a large volume, the pump and the fan of a relative energy-consuming, these not only limit applicable space and use of the water-cooling type heat dissipating devices, but also increase the manufacture and operation cost. To develop technical means that can solve the various problems of the conventional heat dissipating device is main aspect of the present application.

SUMMARY OF THE INVENTION

To achieve the above aspect, the present application provides a heat dissipating device including a box, a flow dispersion layer, a heat exchange layer, a fan and a pump. The box includes a liquid storage part, a liquid-air mixing part, a liquid inlet, a liquid outlet, an air inlet and an air outlet, wherein the liquid-air mixing part is located upon the liquid storage part, the liquid inlet is located upon the liquid-air mixing part, and the air inlet and the air outlet are located on opposite two sides of the liquid-air mixing part. The flow dispersion layer is disposed in the liquid-air mixing part, and has through holes. The heat exchange layer is disposed in the liquid-air mixing part, and has a continuous phase framework and pores. The fan is disposed outside the box, and is connected to the air inlet. The pump is connected to the liquid outlet. A liquid that absorbed heat of a heat source flows into the flow dispersion layer through the liquid inlet: the through holes of the flow dispersion layer disperse the liquid into droplets: the fan introduces air at a temperature lower than a temperature of the droplets into the heat exchange layer through the air inlet: the droplets that flowed into the heat exchange layer exchange heat with the air in the continuous phase framework and the pores; the air that flowed out of the heat exchange layer flows out of the box through the air outlet: the liquid storage part collects the droplets that flowed out of the heat exchange layer to be heat dissipated liquid; and the pump transfers the heat dissipated liquid to the heat source through the liquid outlet.

In an embodiment, horizontal widths of the liquid-air mixing part gradually increase toward a side of the liquid storage part along a direction perpendicular to the box.

In an embodiment, a location of the air outlet is higher than a location of the air inlet.

In an embodiment, the pores account for 70% to 90% of volume of the heat exchange layer.

In an embodiment, the heat exchange layer includes at least a metal foam, a metal mesh or a metal sponge.

In an embodiment, the pump is disposed in the liquid storage part, and the liquid outlet is located upon the liquid-air mixing part.

In an embodiment, the heat dissipating device further includes guide plates, disposed on the air inlet and the air outlet, for guiding the air to pass through the heat exchange layer.

In an embodiment, the heat dissipating device further includes an air filter, connected to the fan.

In an embodiment, the heat dissipating device further includes a liquid level sensor, disposed in the liquid storage part, when the liquid level sensor senses that the heat dissipated liquid is lower than a low limit, the liquid level sensor generates a signal of supplementing the liquid.

In the present application, the flow dispersion layer forcibly disperses the heat absorbed liquid into droplets, the heat exchange layer prolongs falling time of high temperature droplets to allow the lower temperature air flow directly absorbs the heat of the droplets; in comparison with the conventional technology, the heat dissipation efficiency is greatly enhanced, and the liquid usage is reduced at the same time, so that the heat dissipating device of the present application meets the heat dissipation requirements of electronics, air conditioning and other industries.

BRIEF DESCRIPTION OF THE DRAWINGS

The invention of the present application will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
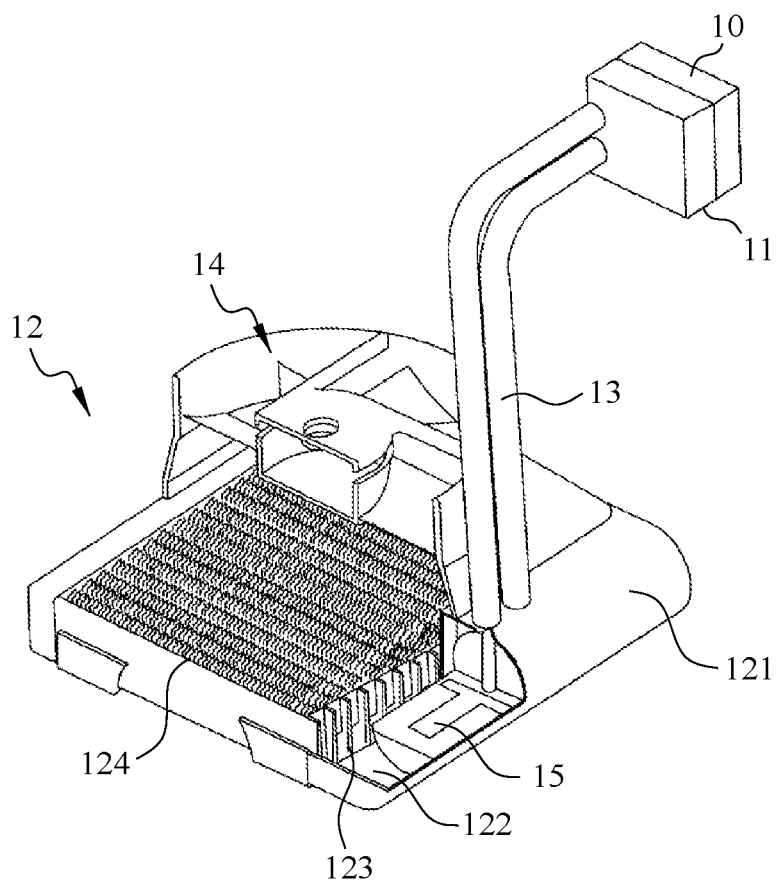
FIG. 1 schematically illustrates a conventional water-cooling type heat dissipating device.
Figure 2A:
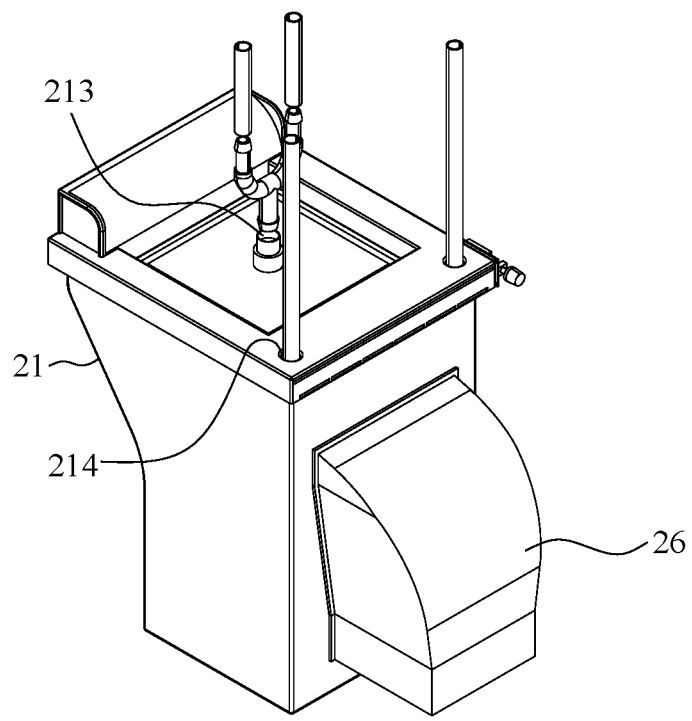
FIG. 2A schematically illustrates a three-dimensional view of the heat dissipating device of the first embodiment of the present application, FIG. 2B schematically illustrates a side-sectional view of the heat dissipating device of the first embodiment of the present application.
Figure 2B:
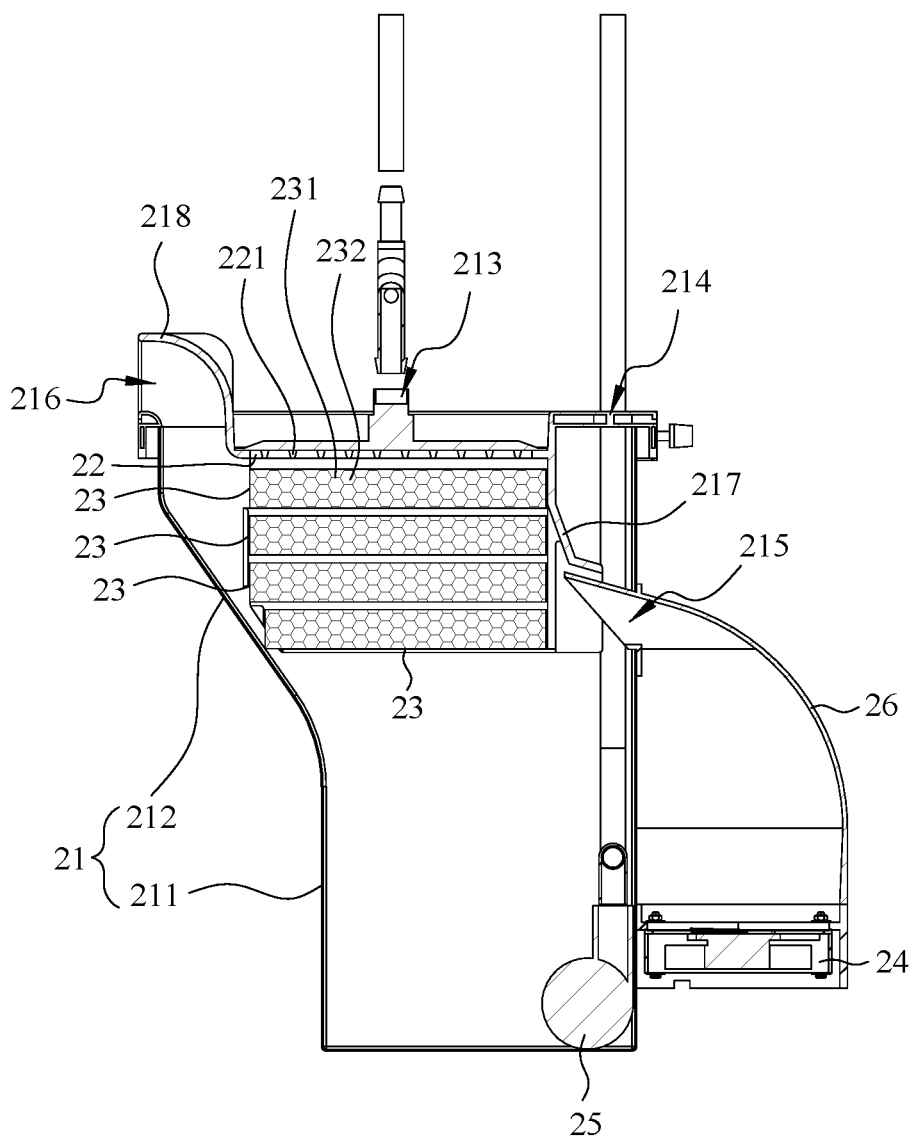

FIG. 2A and FIG. 2B schematically illustrate three-dimensional and side-sectional views of the heat dissipating device of the first embodiment of the present application. As shown in FIG. 2A and FIG. 2B, in this embodiment, a heat dissipating device 2 includes a box 21, a flow dispersion layer 22, a heat exchange layer 23, a fan 24, a pump 25 and an air hood 26. The box 21 includes a liquid storage part 211, a liquid-air mixing part 212, a liquid inlet 213, a liquid outlet 214, an air inlet 215 and an air outlet 216, wherein the liquid-air mixing part 212 is located upon the liquid storage part 211, the liquid inlet 213 and the liquid outlet 214 are located upon the liquid-air mixing part 212, the air inlet 215 and the air outlet 216 are located on opposite two sides of the liquid-air mixing part 212. The flow dispersion layer 22 and the heat exchange layer 23 are disposed in the liquid-air mixing part 212, the flow dispersion layer 22 has a plurality of through holes 221, and the heat exchange layer 23 has a continuous phase framework 231 and a plurality of pores 232 formed within the continuous phase framework 231. The air hood 26 is connected to an outer surface of a side of the box 21, and communicates with the air inlet 215. The fan 24 is disposed in the air hood 26, and can be connected to an external power supply (not shown). The pump 25 is disposed in the liquid storage part 211, and can be connected to the external power supply (not shown).

A pipeline (not shown) connects to a heat source (not shown) and the liquid inlet 213 and the liquid outlet 214 of the heat dissipating device 2, a liquid (e.g. water or aqueous solution with ethylene glycol and other ingredients added) absorbs heat of the heat source (e.g. central processing unit and graphic processing unit of server, or thermoelectric cooling chip), the liquid that absorbed heat flows into the flow dispersion layer 22 through the pipeline and the liquid inlet 213, and then the through holes 221 of the flow dispersion layer 22 disperse the liquid into a plurality of droplets. The fan 24 introduces air outside the box 21 at a temperature lower than the temperature of the droplets into the heat exchange layer 23 through the air inlet 215, the droplets that flowed into the heat exchange layer 23 exchange heat with the air in the continuous phase framework 231 and the pores 232, the heat absorbed air that flowed out of the heat exchange layer 23 flows out of the box 21 through the air outlet 216, the liquid storage part 211 collects the heat dissipated droplets that flowed out of the heat exchange layer 23 to be heat dissipated liquid, and the pump 25 transfers the heat dissipated liquid through the liquid outlet 214 to the heat source again to absorb the heat.

There is no special restriction on material of the box 21, the material is, for example, engineering plastics or rust-resistant metals: the liquid storage part 211 can be a cuboid or a cylinder, and a volume thereof depends on required liquid volume (for example, 3 liters to 15 liters or more). Along a direction perpendicular to the box 21 (as shown on Y-axis in FIG. 2B), horizontal widths (as shown on X-axis in FIG. 2B) of the liquid-air mixing part 212 gradually increase toward a side of the liquid storage part 211; that is, a side cross-sectional profile of the liquid-air mixing part 212 is about a trapezoid with wide top and narrow bottom. The air inlet 215 is located on the side (vertical side) of the liquid-air mixing part 212 that the widths do not increase, the air outlet 216 is located on the side (inclined side) of the liquid-air mixing part 212 that the widths increase, and the location of the air outlet 216 is higher than the location of the air inlet 215. When the heat dissipating device 2 is applied to indoor or vehicle air conditioners, isolation or buffer element can be added to outer surface of the box 21, to prevent performance thereof from being affected by ambient temperature or vibration disturbance.

The flow dispersion layer 22 can be made of plastic plate or rust-resistant metal plate, a main function of the through holes 221 of the flow dispersion layer 22 is to forcibly disperse the heat absorbed liquid into droplets as much as possible, a total surface area of the droplets is much larger than a surface area of the liquid, so as to enhance heat dissipation; however, the through holes 221 should avoid excessively slowing flow rate and circulation rate of the liquid at the same time of dispersing the liquid into the droplets as much as possible. There is no special restriction on shapes of the through holes 221, such as but not limited to conical, cylindrical, spiral, sizes of the droplets produced thereby are about sizes of droplets produced by shower heads to water mist nozzles (e.g. 0.1 mm to 0.5 mm).

A number of the heat exchange layer 23 included in the heat dissipating device 2 can be one or plural, the heat exchange layer 23 can be made to a block structure having the continuous phase framework 231 and the pores 231 formed within the continuous phase framework 231 by using metal materials (e.g. nickel, aluminum, nickel alloy, aluminum alloy, etc.) that have high thermal conductivity and rust resistance. For example, the heat exchange layer 23 includes one or plural metal foams, one or plural metal meshes and/or one or plural metal sponges, wherein the plural metal meshes are horizontally or vertically arranged, and the metal sponge is formed by intertwining a plurality of metal strips. The continuous phase framework 231 having a large thermal conduction area and a high thermal conductivity can greatly improve the heat dissipating amount and rate (heat dissipating flow) of the droplets, and the pores 232 allow the cooler air pass through to absorb the heat of the droplets and the continuous phase framework 231. Depending on the heat dissipation requirement, the heat exchange layers 23 having different sizes of the continuous phase frameworks and the pores can be used: for example, the metal foam has a thickness between 10 mm and 200 mm, a porosity between 70% and 90% by volume, and a pore size between 0.5 mm$^2$ and 3.0 mm$^2$.

The fan 24 can be selected from an axial flow fan, a centrifugal fan, a blast fan and a cross flow fan: a rotation speed, air volume, power, quantity of the fan 24 can be determined by the requirements of the cooling air flow that passes through the air path of the heat exchange layer 2. In this embodiment, the fan 24 is the axial flow fan, and the heat dissipating device 2 further includes guide plates 217, 218 which are disposed on the air inlet 215 and the air outlet 216, for guiding the air to pass through the heat exchange layer. The air hood 26 in combination with the guide plates 217, 218 can concentrate and guide the air to pass through the heat exchange layer 23, so as to further improve heat exchange efficiency of the air and the liquid (the droplets).

According to a space of accommodating the heat dissipating device 2, the pump 25 can be selected from a submerged pump disposed inside the box 21 or a suction pump disposed outside the box 21. In this embodiment, the submerged pump disposed in the liquid storage part 211 is used for the pump 25, which communicates with the liquid outlet 214 via the pipeline. Lift and flow of the pump 25 can be determined by the heat generating of the heat source, the liquid amount for temperature control, length of the pipeline, and other factors: for example, the lift is 8 meters to 25 meters, the maximum amount of the liquid is 50 L/min to 500 L/min. In other embodiments, the liquid outlet is located on lower side of the liquid storage part, and the suction pump disposed outside the box and communicating with the liquid outlet via the pipeline is used for the pump, so as to increase capacity of the liquid storage part or reduce the volume of the box.

Figure 3A:
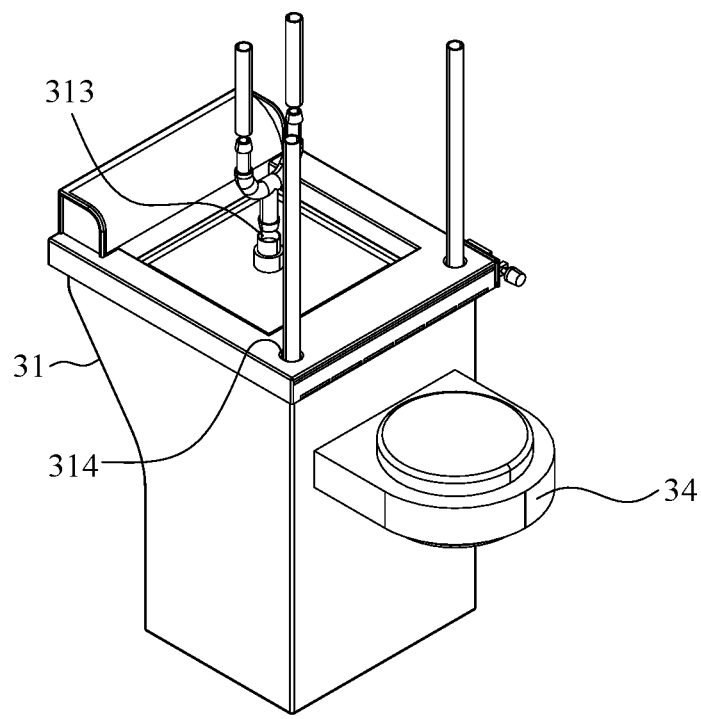
FIG. 3A schematically illustrates three-dimensional view of the heat dissipating device of the second embodiment of the present application, FIG. 3B schematically illustrates a side-sectional view of the heat dissipating device of the second embodiment of the present application.
Figure 3B:
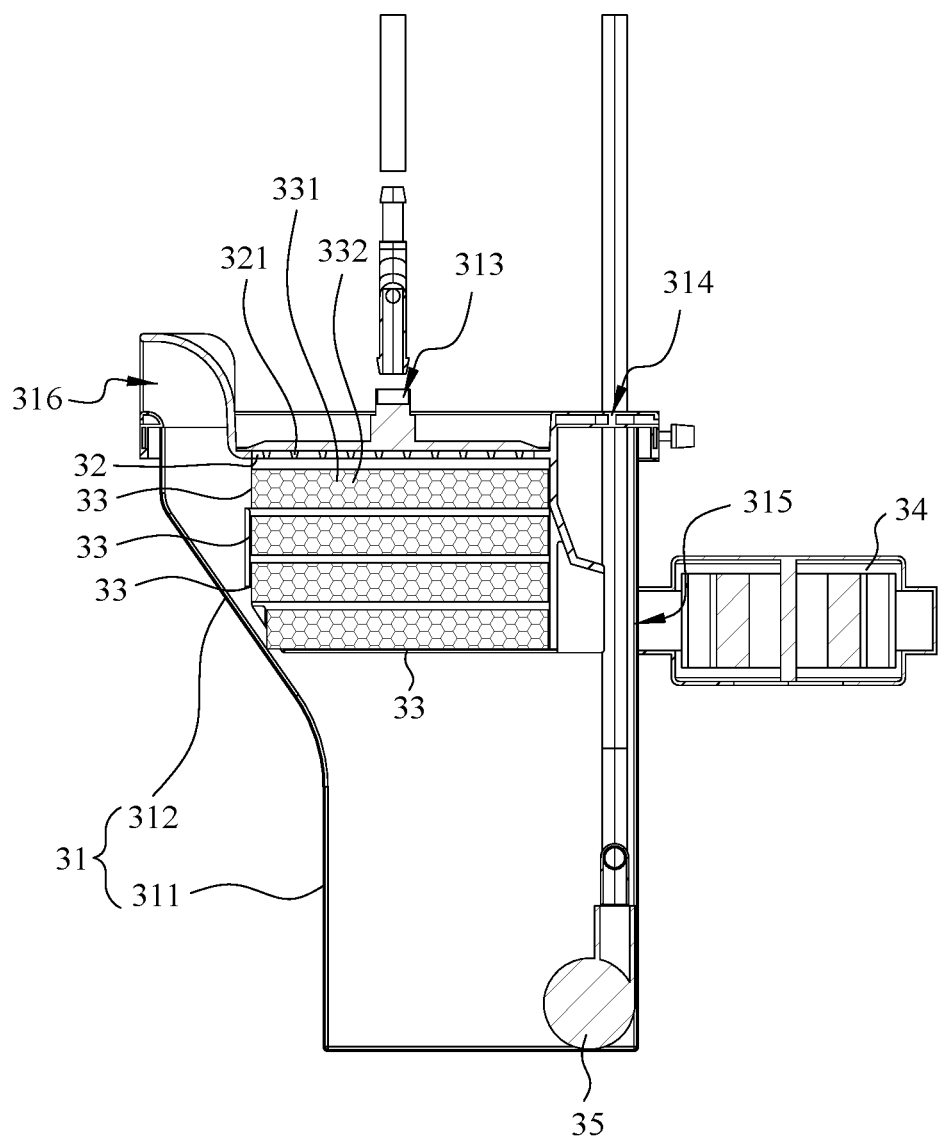

FIG. 3A and FIG. 3B schematically illustrate three-dimensional and side-sectional views of the heat dissipating device of the second embodiment of the present application. As shown in FIG. 3A and FIG. 3B, in this embodiment, a heat dissipating device 3 includes a box 31, a flow dispersion layer 32, a heat exchange layer 33, a fan 34 and a pump 35. The box 31 includes a liquid storage part 311, a liquid-air mixing part 312, a liquid inlet 313, a liquid outlet 314, an air inlet 315 and an air outlet 316, wherein the liquid-air mixing part 312 is located upon the liquid storage part 311, the liquid inlet 313 and the liquid outlet 314 are located upon the liquid-air mixing part 312, and the air inlet 315 and air outlet 316 are located on opposite two sides of the liquid-air mixing part 312. The flow dispersion layer 32 and the heat exchange layer 33 are disposed in the liquid-air mixing part 312, the flow dispersion layer 32 has a plurality of through holes 321, and the heat exchange layer 33 has a continuous phase framework 331 and a plurality of pores 332 formed within the continuous phase framework 331. The fan 34 is disposed outside the box 31 and communicates with the air inlet 315. The pump 25 is disposed in the liquid storage part 311. The fan 34 and the pump 35 can be connected to an external power supply respectively (not shown).

The structures, specifications, actions and functions of the box 31, the flow dispersion layer 32, the heat exchange layer 33 and the pump 35 are same as the description in the first embodiment. The centrifugal fan or the blast fan is used for the fan 34, and the outlet of the fan 34 directly communicates with the air outlet 315 to reduce back pressure of the air and to increase the flow rate of the air. The heat absorbed liquid passes through the liquid inlet 313 and the through holes 321 of the flow dispersion layer 32 then to be dispersed into the droplets, the fan 34 introduces high speed air into the heat exchange layer 33, the droplets that flowed into the heat exchange layer 33 exchange heat with the high speed air in the continuous phase framework 331 and the pores 332 of the heat exchange layer 33, the heat absorbed air that flowed out of the heat exchange layer 33 flows out of the box 31 through the air outlet 316, the heat dissipated droplets that flowed out of the heat exchange layer 33 flows to the liquid storage part 311, the liquid storage part 311 collects the droplets to be heat dissipated liquid, and the pump 35 transfers the heat dissipated liquid through the liquid outlet 314 to the heat source again to absorb the heat.

If it is considered that impurities in the external air accumulates in the heat exchange layer or the liquid and affect the heat exchange efficiency, an air filter (not shown) can be installed in inlet of the fan 24. Due the box, the flow dispersion layer and the heat exchange layer are not a close flow channel, the liquid will gradually evaporate, in the heat dissipating device 2, 3 of the present application, a liquid level sensor can be disposed in the liquid storage part 211, when the liquid level sensor senses that the heat dissipated liquid in the liquid storage part 211, 311 is lower than a low limit, the liquid level sensor immediately generates a signal of supplementing the liquid to notice an user to supplement the liquid so as to maintain the liquid level in a safe operating range.

In an ideal state of complete heat exchange, if the heat generated by the heat source per unit time (−Hsource) is equal to the heat absorbed by the liquid per unit time (+Hliquid), and the heat dissipated by the liquid per unit time (−Hliquid) is equal to the heat absorbed by the air per unit time (+Hair), then the result of the heat exchange will be only the temperature of the air raised and the temperatures of the heat source and the heat dissipated liquid not raised: if the heat generated by the heat source per unit time (−Hsource) is more than the heat absorbed by the liquid per unit time (+Hliquid), or the heat dissipated by the liquid per unit time (−Hliquid) is more than the heat absorbed by the air per unit time (+Hair), then the result of the heat exchange will be the temperatures of the heat source and the heat dissipated liquid gradually raised due to the heat accumulation, and the liquid whose temperature gradually raises will affect the heat absorption of next heat exchange. Accordingly, it can be seen that the temperature of the heat dissipated liquid can be one of the judgment indicators for the heat dissipation efficiency of the heat dissipating devices.

The thermoelectric cooling (TEC) chip can form a hot surface and a cold surface, where has a temperature difference, after P pole and N pole of its semiconductor is input a voltage: if the heat dissipation of the hot surface is poor, then the cold surface will not produce a coolness desired, and even TEC chip will be burned: therefore, the heat dissipation requirements of TEC chip are higher than the heat dissipation requirements of the central processing unit (CPU) or graphic processing unit (GPU) of the computers and the servers. Under a condition of the same volume, the heat exchange area of the heat dissipating device according to the present application is at least more than ten times of the heat exchange area of the conventional water-cooling type heat exchange dissipating device, and the liquid directly contacts the air to exchange heat in the heat exchange layer: therefore, in applications to the installation space with limitation (e.g. the vehicle air conditioners), the heat dissipating device of the present application can use the minimum volume of the liquid to repeatedly absorb and dissipate heat, and ensure that the heat sufficiently dissipated liquid can be transferred again to absorb the heat of the hot surface: specifically, even on a long term operation, the temperature difference between the liquid in the device of the present application and the environment can be kept within 5° C., so that the heat dissipation efficiency of the device of the present application far exceeds the conventional water-cooling type heat dissipating devices.

The heat dissipating device of the present application and the conventional water-cooling type heat dissipating device are practically tested by using TEC chip. The cold surface of TEC chip connected to the conventional device can only produce a coldness about 0 to 5° C. after two minutes operation, due the heat dissipation efficiency of the conventional device cannot meet the heat dissipation requirements of TEC chip, the temperature of the cold surface gradually raises and cannot continue to provide sufficient coolness. The cold surface of TEC chip connected to the device of the present application can produce a coolness about −30° C. after 10 seconds operation and keep the coolness constant, the temperature of the heat dissipated liquid is not higher than the temperature of the outside air (i.e. ambient temperature) by 5° C., even approaches to the temperature of the outside air. The test indicates that the heat dissipation of the hot surface of TEC chip connected to the device of the present application is extremely well; that is, the heat dissipation efficiency of the heat dissipating device of the present application can meet the heat dissipation requirements of TEC chip, CPU and GPU.

In summary, in the heat dissipating device of the present application, the flow dispersion layer forcibly disperses the heat absorbed liquid into droplets, the heat exchange layer prolongs falling time of high temperature droplets to allow the lower temperature air flow directly absorbs the heat of the droplets; in comparison with the conventional technology, the heat dissipation efficiency is greatly enhanced, and the liquid usage is reduced at the same time, so that the heat dissipating device of the present application meets the heat dissipation requirements of electronics, air conditioning and other industries.

Although the present invention has been described with reference to the preferred embodiments thereof, it is apparent to those skilled in the art that a variety of modifications, combinations and changes may be made without departing from the scope of the present invention which is intended to be defined by the appended claims.

What is claimed is:

1. A heat dissipating device, comprising:
a box, comprising a liquid storage part, a liquid-air mixing part, a liquid inlet, a liquid outlet, an air inlet and an air outlet, wherein the liquid-air mixing part is located upon the liquid storage part, the liquid inlet is located upon the liquid-air mixing part, and the air inlet and the air outlet are located on opposite two sides of the liquid-air mixing part;
a flow dispersion layer, disposed in the liquid-air mixing part, having through holes;
a heat exchange layer, disposed in the liquid-air mixing part, having a continuous phase framework and pores;
a fan, disposed outside the box, and connected to the air inlet; and
a pump, connected to the liquid outlet;
wherein a liquid that absorbed heat of a heat source flows into the flow dispersion layer through the liquid inlet; the through holes of the flow dispersion layer disperse the liquid into droplets; the fan introduces air at a temperature lower than a temperature of the droplets into the heat exchange layer through the air inlet; the droplets that flowed into the heat exchange layer exchange heat with the air in the continuous phase framework and the pores, and guide plates disposed on the air inlet and the air outlet guide the air to pass through the heat exchange layer; the air that flowed out of the heat exchange layer flows out of the box through the air outlet; the liquid storage part collects the droplets that flowed out of the heat exchange layer to be heat dissipated liquid; and the pump transfers the heat dissipated liquid to the heat source through the liquid outlet.

2. The heat dissipating device according to claim 1, wherein horizontal widths of the liquid-air mixing part gradually increase toward a side of the liquid storage part along a direction perpendicular to the box.

3. The heat dissipating device according to claim 1, wherein a location of the air outlet is higher than a location of the air inlet.

4. The heat dissipating device according to claim 1, wherein the pores account for 70% to 90% of volume of the heat exchange layer.

5. The heat dissipating device according to claim 1, wherein the heat exchange layer comprises at least a metal foam, a metal mesh or a metal sponge.

6. The heat dissipating device according to claim 1, wherein the pump is disposed in the liquid storage part, and the liquid outlet is located upon the liquid-air mixing part.

7. The heat dissipating device according to claim 1, wherein the pump is disposed outside the box, and the liquid outlet is located on the liquid storage part.

8. The heat dissipating device according to claim 1, further comprising an air filter, connected to the fan.

9. The heat dissipating device according to claim 1, further comprising a liquid level sensor, disposed in the liquid storage part, when the liquid level sensor senses that the heat dissipated liquid is lower than a low limit, the liquid level sensor generates a signal of supplementing the liquid.

* * * * *